United States Patent
Gao et al.

(10) Patent No.: US 7,682,175 B2
(45) Date of Patent: Mar. 23, 2010

(54) BURN-IN SOCKET

(75) Inventors: Liang Gao, Shenzhen (CN); Ming-Yue Chen, Tu-Cheng (TW); Jia-Jia Cai, Shenzhen (CN); Zhen-Qi Yang, Shenzhen (CN); Sung-Pei Hou, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/535,389

(22) Filed: Aug. 4, 2009

(65) Prior Publication Data

US 2010/0029112 A1 Feb. 4, 2010

(51) Int. Cl.
*H01R 11/22* (2006.01)
(52) U.S. Cl. ...................... 439/268; 439/263
(58) Field of Classification Search ............ 439/259, 439/263, 266, 268
See application file for complete search history.

(56) References Cited

U.S. PATENT DOCUMENTS 6,471,531 B2 * 10/2002 Kanesashi ............... 439/268

* cited by examiner

*Primary Examiner*—Tho D Ta
(74) *Attorney, Agent, or Firm*—Andrew C. Cheng; Wei Te Chung; Ming Chieh Chang

(57) ABSTRACT

A burn-in socket includes a base, a sliding plate mounted to the base and having a number of pin holes, a number of contacts secured to the base and an actuator mounted on the base. The contacts each comprise a base portion and a pair of arms received in the pin holes of the sliding plate. The actuator includes a frame and a number of actuating portion for driving the sliding plate to move in a transversal direction. The sliding plate includes a number of projections adjacent to contacts. Each projection and the pair of arms of an adjacent contact together define a receiving space and located at three sides of the receiving space, respectively.

16 Claims, 4 Drawing Sheets

BURN-IN SOCKET

BACKGROUND OF THE INVENTION

1. Field of the Invention

The present invention relates to a burn-in socket, and more particularly to a burn-in socket mounted on a printed circuit board (PCB) for testing an IC package.

2. Description of Prior Art

Central Processing Unit (CPU) and other electrical package, generally referred to as IC package, are undergone a test simulating its real working environment so as to make sure its functions from all intended ranges.

A conventional burn-in socket typically comprises a base, a plurality of contacts disposed on the base, latches, a sliding plate for driving the contacts, and an actuator for actuating the latches and the sliding plate. The contact each has a pair of arms inserted into the sliding plate and one is stationary, the other is moveable. When pressing the actuator and driving the sliding plate to move in a transversal direction and further make the moving arm away from the stationary arm to create a space therebetween, solder balls of the IC package can be disposed in between the pair of arms. When the actuator is released, the moving arm will close toward the stationary arm and sandwich the solder ball therebetween. However, when the IC package is disposed between the pair of arms, the solder balls will offset from their true positions or be sandwiched by wrong arms, which results in the pair of the contacts can't reliably mating with the corresponding solder balls and further affect the electrical connection between the IC package and the burn-in socket.

Thus, there is a need to provide an improved burn-in socket to overcome the above-mentioned problems.

SUMMARY OF THE INVENTION

An object of the present invention is to provide a burn-in socket for accurately positioning solder balls of an IC package during testing.

In order to achieve the object set forth, a burn-in socket comprises A burn-in socket comprises a base, a sliding plate mounted to the base with a plurality of pin holes, a plurality rows of contacts and an actuator mounted on the base and including a frame and a plurality of actuating portion extending downwardly form the frame for driving the sliding plate to move in a transversal direction. Each contact comprises a base portion secured to the base and a pair of arms extending through the pin holes of the sliding plate. The sliding plate includes at least one longitudinal beam located between two rows of pin holes and having a plurality of projections adjacent to a plurality of contacts. Each projection and the pair of arms of an adjacent contact together define a receiving space and located at three sides of the receiving space, respectively.

BRIEF DESCRIPTION OF THE DRAWINGS

Other objects, advantages and novel features of the present invention will become more apparent from the following detailed description when taken in conjunction with the accompanying drawings, in which.

DESCRIPTION OF PREFERRED EMBODIMENT

Figure 1:
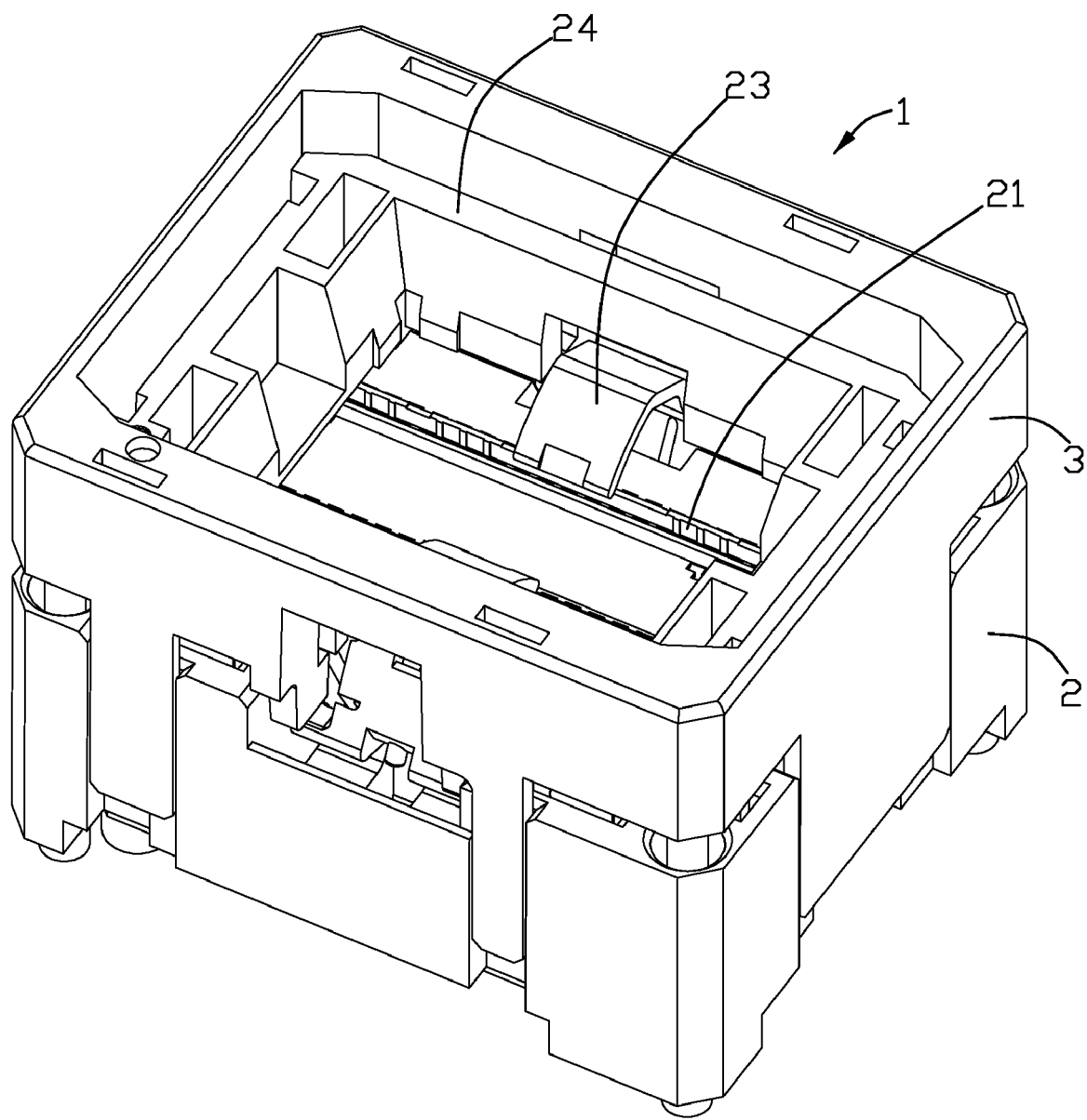
FIG. 1 is an assembled, perspective view of a burn-in socket in accordance with a preferred embodiment of the present invention.
Figure 2:
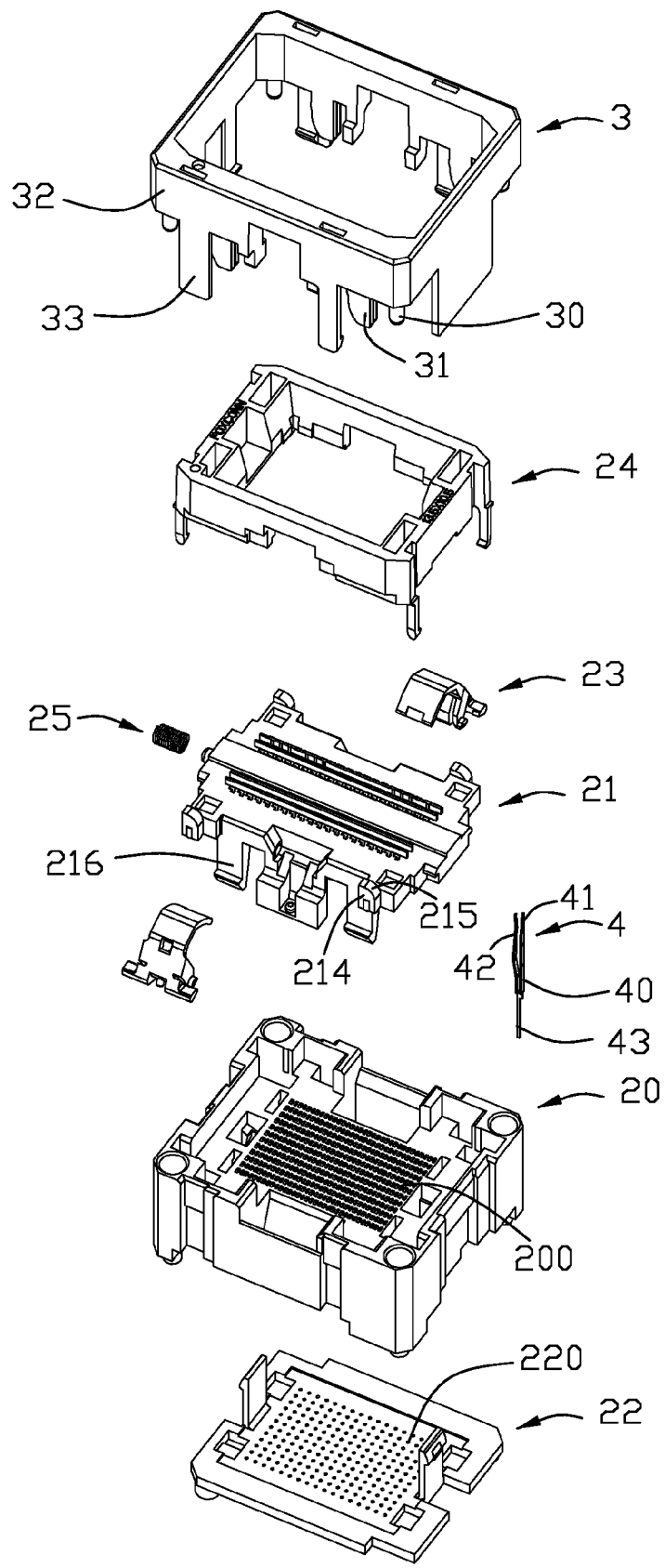
FIG. 2 is an exploded, perspective view of the burn-in socket shown in FIG. 1.

Referring to FIGS. 1-2, a burn-in socket 1 in accordance with a preferred embodiment of the present invention is generally mounted to a printed circuit board (not shown) to receive and test an IC package (not shown). The burn-in socket 1 includes a socket body 2, a plurality of contacts 4 mounted to the socket body 2, and an actuator 3 movably mounted upon the socket body 2. The IC package is put into the socket body 2 to be tested.

Figure 3:
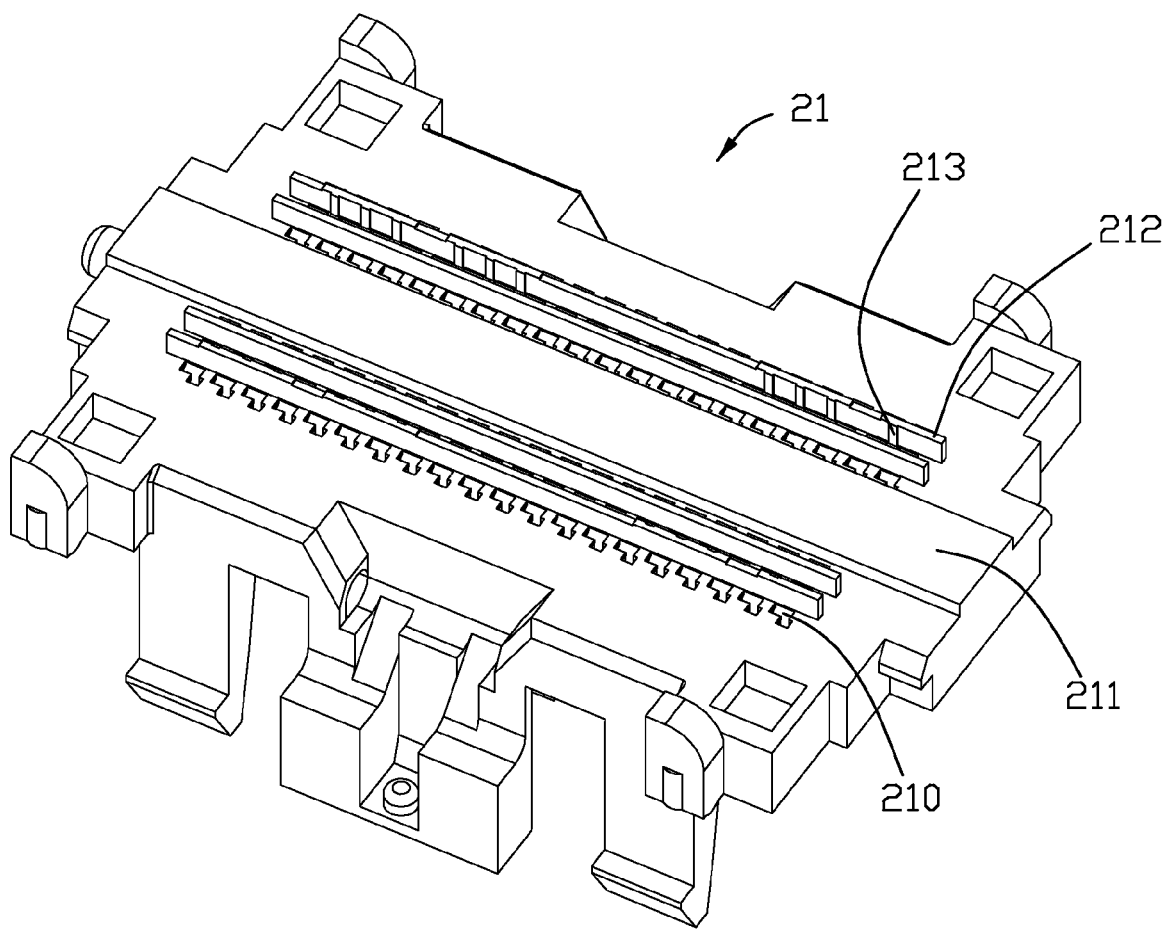
FIG. 3 is a perspective view of a sliding plate of the burn-in socket shown in FIG. 2.
Figure 4:
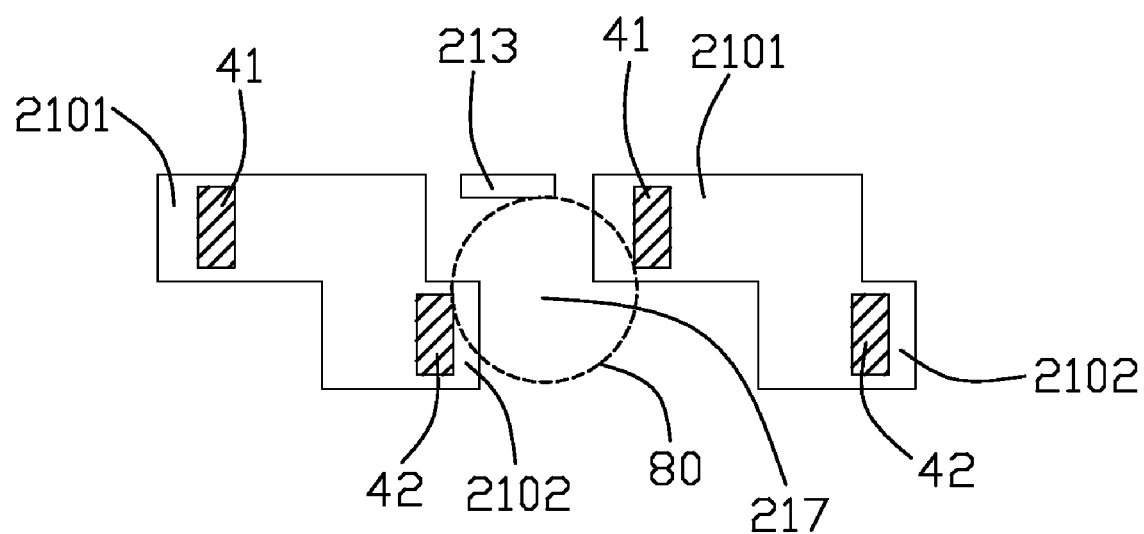
FIG. 4 is a sketch view showing how the sliding plates positioning solder ball of an IC package.

Referring to FIGS. 3-4, the contact 4 includes a middle base portion 40, a pair of testing arms respectively extending upwardly from the base portion 40, and a tail portion 43 extending downwardly from the base portion 40. The pair of testing arms includes a fixed ram 41 with a linear configuration and a moving arm 42 movable relative to the stationary arm 41. The top ends of the testing arms are respectively formed with tip portions so as to jointly clip one solder ball 80 (shown in FIG. 4) of the IC package in a first direction.

Particularly referring to FIGS. 2-4, the socket body 2 includes a base 20, a positioning frame 24 received in the base 20, a sliding plate 21 disposed on the positioning frame 24, a bottom plate 22 fixed to bottom side of the base 20, and a pair of locking elements 23 to jointly lock the IC package loaded on the sliding plate 21. The bottom plate 22, the base 20, and the sliding plate 21 respectively define a plurality of pin holes 220, 200, 210, extending therethrough for the contacts 4 passing through. The base portion 40 is retained in the pin holes 200 of the base 20, and the tip portions extend out of the pin holes 210 of the sliding plate 21, while the tail portion 43 extends downwardly and out of the pin hole 220 of the bottom plate 22.

The sliding plate 21 slides transversally by the actuation of the actuator 3 and has a projecting plate 211 at a center thereof to support the IC package. The projecting plate 211 is higher than the pin holes 210. The sliding plate 21 has a bearing section 214 which forms a curved guiding surface 215 for mating with the actuator 3. The sliding plate 21 is equipped with a spring 24 with one end thereof abutting against the sliding plate 21 and the other end abutting against the base 20, thereby driving the sliding plate 21 back to its original position after the transversal movement. A plurality of latches 216 project downwardly from the sliding plated 21 for securing the sliding plate 21 on the socket body 2.

Each pin hole 210 of the sliding plate 21 includes of a first hole 2101 for receiving the stationary arm 41 and a second hole 2102 for receiving the moving arm 42. The first hole 2101 is longer than the second hole 2102 so that the stationary arm 41 can't move respect to the base 20 and the moving arm 42 move away from the stationary arm 41. Please be noted, in the preferred embodiment of the present intention, the same pin hole 210 receives a stationary arm 41 of one contact and a moving arm 42 of a neighboring contact.

The actuator 3 has a main frame 32, two pair of latches 33 for positioning the actuator 3 on the base 2, four posts 30 extending downwardly from the frame 32, and an actuating portion 31 extending downwardly from the frame 52 for driving the bearing section 214 of the sliding plate 21.

The moving and stationary arms 41, 42 are spaced from each other and the two locking elements 23 turn to an opened state when the actuator 3 is in a lower position. In this situation, the IC package is easy to be easily placed into the socket body 2 or to be taken out of the socket body 2. When the actuator 3 returns to an original position, the moving and stationary arms 41, 42 move close to each other and jointly and clip the solder ball 80 of the IC package as shown in FIG. 4. The locking elements 23 are pressed on the IC package. It's a known technology concerning to the configuration of the sliding plate 21 and the principles about how to actuate the contacts 4, and will not be specifically described herein. Besides, a spring 52 is provided between the actuator 3 and the socket body 2 so as to reset the actuator 3 after its downward movement.

The sliding plate 21 also includes a plurality of longitudinal beams 212 located between two rows of pin holes 210. The longitudinal beam 212 is provided with a plurality of projections 213. The tip portions of the contact 4 extend out of the pin holes 210 corresponding to the projections 213. Each projection 213 is located on top of the pin hole 210 and defines a receiving space with the pair of arms and for accommodating the solder ball 80 at three sides. When the solder ball 80 is inserted into the receiving space, the projection 213 limits the solder ball 80 in a second direction perpendicular to the first direction thereby guiding the solder ball 80 inserted into a true position and sandwiched by the pair of arms. The solder ball 80 is connected with the pair of arms simultaneously whereby assures the electrical connection between the IC package and the burn-in socket.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket comprising:
   a base;
   a sliding plate mounted to the base and having a plurality of pin holes;
   a plural rows of contacts and each contact comprising a base portion secured to the base and a pair of arms extending through the pin holes of the sliding plate; and
   an actuator mounted on the base and including a frame and a plurality of actuating portion extending downwardly form the frame for driving the sliding plate to move in a transversal direction,
   the sliding plate including at least one longitudinal beam located between two rows of pin holes and having a plurality of projections adjacent to a plurality of contacts, each projection and the pair of arms of an adjacent contact together defining a receiving space and located at three sides of the receiving space, respectively.

2. The burn-in socket as claimed in claim 1, wherein the sliding plate has a projecting plate at a center thereof to support the IC package.

3. The burn-in socket as claimed in claim 2, wherein the projecting plate is higher than the pin holes.

4. The burn-in socket as claimed in claim 1, wherein the sliding plate has a bearing section with a curved guiding surface formed thereon for mating with the actuator.

5. The burn-in socket as claimed in claim 1, wherein the actuator moves relative to the base in a vertical direction.

6. The burn-in socket as claimed in claim 1, wherein each contact comprises a stationary arm and a moving arm, and the sliding plate drives the moving arm relative to the stationary arm.

7. The burn-in socket as claimed in claim 6, further comprising a pair of locking elements, and the locking elements lock an IC package loaded on the sliding plate.

8. A burn-in socket for testing an IC package with solder balls, comprising:
   a base;
   a sliding plate mounted to the base and having a plurality of pin holes;
   a plurality of contacts each comprising a base portion secured to the base and a pair of arms extending through the pin holes of the sliding plate; and
   an actuator mounted on the base and including a frame and a plurality of actuating portion extending downwardly form the frame for driving the sliding plate to move in a transversal direction;
   the pair of arms including a stationary arm and a moving arm contacting with a solder ball and sandwich the solder ball in a first direction, the sliding plate including at least one projection adjacent to the pair of arms respectively and positioning the solder ball in a second direction perpendicular to the first direction.

9. The burn-in socket as claimed in claim 8, wherein the sliding plate has a projecting plate at a center thereof to support the IC package.

10. The burn-in socket as claimed in claim 9, wherein the projecting plate is higher than the pin holes.

11. The burn-in socket as claimed in claim 8, wherein the sliding plate has a bearing section with a curved guiding surface formed thereon for mating with the actuator.

12. The burn-in socket as claimed in claim 8, wherein the actuator moves relative to the base in a vertical direction.

13. The burn-in socket as claimed in claim 8, wherein the burn-in further comprise a pair of locking elements, and the locking elements lock an IC package loaded on the sliding plate.

14. The burn-in socket as claimed in claim 8, wherein each pin hole includes a first hole for receiving the stationary arm and a second hole for receiving the moving arm, and the stationary arm and the moving arm received in the same pin hole belong to different contacts.

15. A burn-in socket for use with an electronic package having solder balls on one undersurface, comprising:
   an insulative base;
   an insulative sliding plate positioned upon the base and moveable relative to the base at least horizontally;
   a plurality of contacts disposed in the base with a moveable arm and a stationary arm both extending above a top face of the sliding plate;
   a plurality protrusions formed on the top face to cooperate with the moveable arm and the stationary arm for defining a solder ball receiving space so as to allow each corresponding solder ball engages both the moveable arm and the stationary arm and further one corresponding protrusion.

16. The burn-in socket as claimed in claim 15, wherein either of said moveable arm and said stationary arm engages the corresponding solder ball in a first direction while the protrusion engages the corresponding solder ball in a second direction perpendicular to said first direction.

* * * * *